(12) United States Patent
Roy-Choudhury et al.

(10) Patent No.: US 11,476,658 B2
(45) Date of Patent: Oct. 18, 2022

(54) COMMUNICATION LESS CONTROL TECHNIQUE FOR HYBRID HVDC (71) Applicant: Hitachi Energy Switzerland AG, Baden (CH)

(72) Inventors: Saurav Roy-Choudhury, Benares (IN);
Ying Jiang-Häfner, Ludvika (SE);
Gaurav-Kumar Kasal, Chennai (IN);
Morteza Mohammadi, Ludvika (SE);
Mats Andersson, Beijing (CN)

(73) Assignee: Hitachi Energy Switzerland AG, Baden (CH)

( * ) Notice: Subject to any disclaimer, the term of this patent is extended or adjusted under 35 U.S.C. 154(b) by 321 days.

(21) Appl. No.: 16/956,031

(22) PCT Filed: Dec. 21, 2017

(86) PCT No.: PCT/EP2017/084039
§ 371 (c)(1),
(2) Date: Jun. 19, 2020

(87) PCT Pub. No.: WO2019/120536
PCT Pub. Date: Jun. 27, 2019

(65) Prior Publication Data
US 2020/0412128 A1 Dec. 31, 2020

(51) Int. Cl.
*H02J 3/36* (2006.01)
*H02H 7/125* (2006.01)
(Continued)

(52) U.S. Cl.
CPC ........... *H02H 7/1257* (2013.01); *G01R 31/52* (2020.01); *H02H 9/02* (2013.01); *H02J 3/36* (2013.01); *H02M 1/32* (2013.01); *H02M 7/4835* (2021.05)

(58) Field of Classification Search
CPC .... H02J 3/36; H02H 9/02; H02H 9/04; H02H 7/1257; H02M 1/32; H02M 7/4835; G01R 31/52
See application file for complete search history.

(56) References Cited

U.S. PATENT DOCUMENTS

2012/0201059 A1 8/2012 Berggren et al.
2013/0016541 A1 1/2013 Norrga et al.
(Continued)

FOREIGN PATENT DOCUMENTS

CN 102856881 A * 1/2013
CN 203326577 U 12/2013
(Continued)

OTHER PUBLICATIONS

Ahmed, Zidi Sid, et al., "Study of Commutation Failures in an HVDC Inverter due to AC System Faults", Conference Paper, retrieved from https://www.researchgate.net/publication/272201790, Nov. 2010, 7 pages.
(Continued)

*Primary Examiner* — Harry R Behm
(74) *Attorney, Agent, or Firm* — Slater Matsil, LLP (57) ABSTRACT

A first converter station is part of a high voltage direct current transmission system that includes a DC transmission link connected to the first converter station a second converter station. A DC current and a DC voltage of the DC transmission link are sensed by the first converter station. It is determined that the sensed DC current is equal to or larger than a threshold current value, that the sensed DC current is equal to or larger than the threshold current value, and that at least a partial recovery of the sensed DC voltage has occurred. On the basis that it is determined that the at least a partial recovery of the sensed DC voltage has occurred, it is determined that a phase-to-ground fault has occurred. In response to determining that a phase-to-ground fault has
(Continued)

occurred, a power delivered by the first converter station can be reduced.

20 Claims, 3 Drawing Sheets

(51) Int. Cl.
   *G01R 31/52* (2020.01)
   *H02M 1/32* (2007.01)
   *H02M 7/483* (2007.01)
   *H02H 9/02* (2006.01)

(56) References Cited

U.S. PATENT DOCUMENTS

| | | | | |
|---|---|---|---|---|
| 2015/0340859 A1* | 11/2015 | Barker | ............... | H02H 3/07 361/62 |
| 2017/0331390 A1* | 11/2017 | Xu | ............... | H02M 5/4585 |
| 2019/0052087 A1* | 2/2019 | Zhao | ............... | H02M 5/4585 |
| 2021/0126555 A1* | 4/2021 | Schoen | ............... | H02M 7/217 |

FOREIGN PATENT DOCUMENTS

| | | | | |
|---|---|---|---|---|
| CN | 105071425 A | 11/2015 | | |
| CN | 105896476 A | 8/2016 | | |
| CN | 106786398 A | 5/2017 | | |
| CN | 206517072 U | 9/2017 | | |
| CN | 107431428 A | 12/2017 | | |
| WO | 2011029480 A1 | 3/2011 | | |
| WO | WO-2018130280 A1 * | 7/2018 | ............... | H02J 3/36 |
| WO | WO-2019096402 A1 * | 5/2019 | ............... | H02H 3/06 |

OTHER PUBLICATIONS

Tang, Geng, et al., "A LCC and MMC hybrid HVDC topology with DC line fault clearance capability", Electrical Power and Energy Systems 62, Jun. 3, 2014, pp. 419-428.

National Intellectual Property Administration of the People's Republic of China, Notification of the First Office Action and Search Report, issued in Application No. 2017800981324, dated Mar. 3, 2021.

* cited by examiner

COMMUNICATION LESS CONTROL TECHNIQUE FOR HYBRID HVDC

CROSS-REFERENCE TO RELATED APPLICATIONS

This patent application is a national stage filing of International Application No. PCT/EP2017/084039, filed on Dec. 21, 2017 and published as WO 2019/120536A1, which application is hereby incorporated by reference in its entirety.

TECHNICAL FIELD

The present disclosure relates to a method of operating a converter station in a high voltage direct current (HVDC) transmission system. More generally, the present disclosure relates to a method of operating such a converter station during at least a phase-to-ground fault at a second HVDC converter station connected to the HVDC converter station via a direct current (DC) transmission link.

BACKGROUND

In a HVDC transmission system, using one or more voltage source converters (VSCs) at the inverting (i.e. receiving) end of a DC transmission link may present advantages. Such advantages may for example include more degrees of freedom in terms of control, the ability to avoid commutation failure and/or an enhanced possibility of connecting to e.g. passive alternating current (AC) loads.

However, during a phase-to-ground fault at the AC terminals of a VSC, the VSC may be subjected to high over voltage stress. In order to avoid for such over voltage stress to cause damage to the VSC, additional protection equipment may be installed. In addition, it may be desirable to communicate the occurrence of such a fault to other units or converters in the same system in order to reduce (or stop) the power transmitted to the failing VSC. As this may result in both an increased cost and overall complexity of the HVDC transmission system, there is a need for both improved converter stations and improved methods of operating the same.

SUMMARY OF THE INVENTION

The present disclosure seeks to at least partially fulfill the above need. To achieve this, a method of operating a converter station, a converter station and a HVDC transmission system as defined in the independent claims are provided. Further embodiments of the present disclosure are provided in the dependent claims.

According to a first aspect of the present disclosure, a method of operating a first converter station in a HVDC transmission system is provided. The HVDC transmission system may include a DC transmission link having a first end at which the first converter station is connected and a second end at which a second converter station is connected. The method may include sensing, at the first end of the DC transmission link, a DC current and a DC voltage of the DC transmission link. The method may further include determining, based on the sensed DC current and the sensed DC voltage, whether a phase-to-ground fault has occurred at the second converter station. The method may further include reducing, on the basis that it is determined that the phase-to-ground fault has occurred, a power delivered by the first converter station to the second converter station via the DC transmission link.

In a conventional HVDC transmission system, determining whether a phase-to-ground fault has occurred at the second converter station is performed at the second converter station, for example by locally measuring a voltage and a current at the second converter station. If it is determined that the phase-to-ground fault has occurred, information indicative of this fault then needs to be transferred to the first converter station (at the rectifying end of the DC transmission link). First then, after receiving this information, the first converter station may reduce the amount of power it delivers to the second converter station. To transfer the information in due time may require a fast and reliable communication channel (such as a radio network or an internet cable) between the converter stations. To establish, and maintain, such a communication channel may add to the cost of the HVDC transmission system, and the reliability of the communication channel may affect the ability of the system to accordingly handle the phase-to-ground fault.

With the method of the present disclosure, sensing of the DC voltage and the DC current, and the determining of whether the phase-to-ground fault has occurred at the second converter station is performed at the first converter station. Phrased differently, both the detection of the occurrence of the phase-to-ground fault (at the second converter station) and the reduction of the power (delivered to the second converter station) may be performed locally at the first converter station. This may eliminate the need for the communication channel, and the HVDC transmission system may be improved both in terms of reduced cost and increased reliability. Phrased differently, the converter station may be operated in a communicationless way. A more reliable way of reducing, or stopping, the power delivered from the first converter station may also reduce the need for oversizing the second converter station. This may for example further reduce the cost of the system.

In some embodiments, determining the occurrence of the phase-to-ground fault may include determining whether the sensed DC current is equal to or larger than a threshold current value. Determining the occurrence of the phase-to-ground fault may further include determining, on the basis that it is determined that the sensed DC current is equal to or larger than the threshold current value, whether at least a partial recovery of the sensed DC voltage has occurred. Determining the occurrence of the phase-to-ground fault may further include determining, on the basis that it is determined that the at least a partial recovery of the sensed DC voltage has occurred, that the phase-to-ground fault has occurred.

A "recovery of the sensed DC voltage" may be defined as the sensed DC voltage reaching the value it had before, or close to, the occurrence of the phase-to-ground fault. Determining that the sensed DC current is equal to or larger than the threshold current value may provide an indication of that a fault has occurred at the inverter side of the system (i.e. at the second converter station). Determining that the sensed DC voltage has at least partially recovered may be done after determining that the sensed DC current is equal to or larger than the threshold current value. Determining that the sensed DC voltage has at least partially recovered may confirm that the indicated fault is a phase-to-ground fault, and discriminate against other faults such as DC bus faults and/or external AC faults (at for example the inverter side of the system, i.e. at the second converter).

In some embodiments, determining the at least a partial recovery of the sensed DC voltage may include determining whether the sensed DC voltage is equal to or larger than a threshold voltage value. Determining the at least a partial recovery of the sensed DC voltage may also include determining, on the basis that it is determined that the sensed DC voltage is equal to or larger than the threshold voltage value, that the at least a partial recovery of the sensed DC voltage has occurred.

In some embodiments, the threshold voltage value may be a value of the sensed DC voltage at a first time. In the method, it may further be determined that the sensed DC voltage is equal to or larger than the threshold voltage value at least before a second time succeeding the first time. For example, the first time may be the time of, or close to, the occurrence of the phase-to-ground fault, and the threshold voltage value may be the value of the sensed DC voltage at the time before, or close to, the occurrence of the phase-to-ground fault (i.e. at the first time). The second time may define the end of a waiting period during which the sensed DC voltage value is expected to once again reach (or exceed) the threshold value, which may confirm or at least indicate that the at least a partial recovery of the sensed DC voltage has occurred.

In some embodiments, the first time may be when it is determined that the sensed DC current is equal to or larger than the threshold current value. The time when it is determined that the sensed DC current is equal to or larger than the threshold current value may for example be taken as the time of the occurrence of the potential phase-to-ground fault at the second converter station. As an alternative, the first time may be when it is determined that the sensed DC current has assumed a maximum current value. The time when the sensed DC current has assumed the maximum current value may for example be taken to indicate the time of the occurrence of a fault (possibly a phase-to-ground fault) at the inverter station (i.e. at the second converter station). In some embodiments, the first time may be when it is determined that the sensed DC current has assumed a maximum current value, with the condition that the sensed DC current has before that reached, or exceeded, the threshold current value.

In some embodiments, a difference between the second time and the first time may be equal to or less than approximately one cycle time of an AC frequency on for example the AC side of the first converter station (e.g. on the rectifier side of the system). The difference between the second time and the first time may for example be equal to or less than approximately 20 milliseconds (which may correspond to an AC frequency of 50 Hz), or be equal to or less than approximately 16 to 17 milliseconds (which may correspond to an AC frequency of 60 Hz), and so on.

In some embodiments, the threshold voltage value may be defined as the value of the sensed DC voltage at the first time.

In some embodiments, determining the at least a partial recovery of the sensed DC voltage may include determining whether a time derivative of the sensed DC voltage is equal to or larger than a threshold voltage time derivative value. Determining the recovery of the at least a partial recovery of the sensed DC voltage may further include determining, on the basis that it is determined that the time derivative of the sensed DC voltage is equal to or larger than the threshold voltage time derivative value, that the at least a partial recovery of the sensed DC voltage has occurred. Herein, a "derivative value" may indicate the rate of change of the sensed DC voltage over time. For example, a positive derivative value (which may exceed the threshold voltage time derivative value) may indicate an at least temporarily increasing sensed DC voltage over time. An at least temporarily increasing sensed DC voltage over time may in turn at least indicate, or confirm, the at least a partial recovery of the sensed DC voltage.

In some embodiments, the threshold current value may be proportional to a power order used to control the first converter station. The power order may also be locally available to the first converter station.

According to a second aspect of the present disclosure, a converter station for a HVDC transmission system is provided. The HVDC transmission system may include a DC transmission link. The converter station may be connectable to a first end of the DC transmission link. The converter station may include a current sensor for sensing a DC current at the first end of the DC transmission link. The converter station may include a voltage sensor for sensing a DC voltage at the first end of the DC transmission link. The converter station may include a controller. The controller may be arranged to determine, based on the sensed DC current and the sensed DC voltage, whether a phase-to-ground fault has occurred at a second converter station connected to a second end of the DC transmission link. The controller may be arranged to control the converter station so as to, on the basis that it is determined that the phase-to-ground fault has occurred, reduce a power delivered by the converter station to the second converter station via the DC transmission link.

The sensed DC current and the sensed DC voltage of the second aspect may correspond to the sensed DC current and the sensed DC voltage, respectively, described above with reference to the method according to the first aspect. Likewise, the other corresponding features and results described with respect to the method of the first aspect may apply also to those of the converter station described according to the second aspect.

In some embodiments, the controller may be arranged to perform any method described according to the first aspect.

In some embodiments, the converter station may include at least one of a line-commutated converter (LCC), a half-bridge modular multilevel converter (HB MMC), and a full-bridge modular multilevel converter (FB MMC).

According to a third aspect of the present disclosure, a HVDC transmission system is provided. The HVDC transmission system may include a first converter station as defined above according to the second aspect. The HVDC transmission may include a second converter station. The HVDC transmission system may include a DC transmission link. The DC transmission link may be connecting the first converter station and the second converter station.

In some embodiments, the second converter station may also be a converter station as defined above according to the second aspect.

In some embodiments, the second converter station may include at least one of a HB MMC and a FB MMC.

In some embodiments, the second converter station may include at least a HB MMC and a FB MMC. The HB MMC and the FB MMC may be connected in series.

In some embodiments, the FB MMC may be connected closer than the HB MMC to a DC transmission line of the DC transmission link. The DC transmission line may be a line on which DC power is delivered to the second converter station from the first converter station.

In some embodiments, the first converter station may include an LCC. For example, in some embodiments, the first converter station may for example include the LCC, and the second converter station may include the series connected FB MMC and the FB MMC, where the FB MMC is connected closer to the DC transmission line on which the power is delivered than the HB MMC.

The present disclosure relates to all possible combinations of features recited in the claims. Objects and features described according to the first aspect may be combinable with, or replaced by, objects and features described according to the second aspect and/or the third aspect, and vice versa.

Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Figure 1:
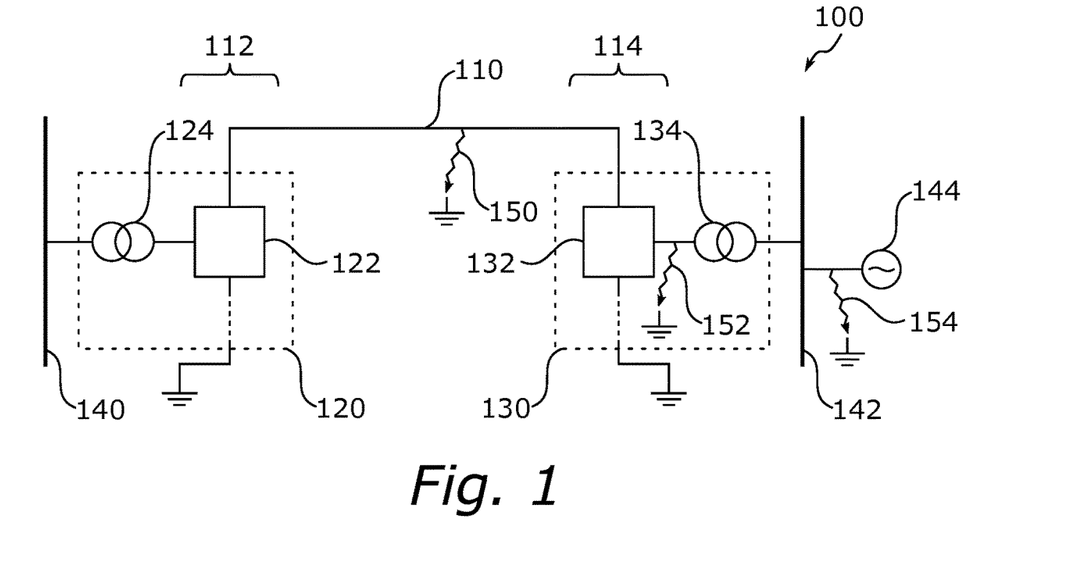
FIG. 1 illustrates schematically a HVDC transmission system.

With reference to FIG. 1, a HVDC transmission system is described in the following.

FIG. 1 illustrates a HVDC transmission system 100. The HVDC transmission system 100 includes a DC transmission link 110 which has a first end 112 and a second end 114. A first converter station 120 is connected to the DC transmission link 110 at the first end 112, and a second converter station 130 is connected to the DC transmission link 110 at the second end 114. The DC transmission link 110 may for example include one or more DC (transmission) lines in which DC current may flow.

The first converter station 120 includes a HVDC converter 122 which is connected to an AC grid 140 via a transformer 124. The transformer 124 may be part of the first converter station 120. It is envisaged that the first converter station 120 may contain more than one HVDC converter 122, and also that more than one transformer 124 may be present in order to connect the first converter station 120 to the AC grid 140. In the HVDC transmission system 100, it may be envisaged that the first converter station 120 operates as a rectifier, such that AC power is received from the AC grid 140 and converted by the one (or more) HVDC converter 122 into DC power.

The second converter station 130 includes a HVDC converter 132 which is connected to an AC grid 142 via a transformer 134. The transformer 134 may be part of the second converter station 130. Together, the HVDC transmission system 100 may operate to transfer power between the AC grid 140 and the AC grid 142. Power may, for example, be transferred from the AC grid 140 to the AC grid 142, and to an AC load 144 connected to the AC grid 142.

As illustrated in FIG. 1, the HVDC transmission system 100 includes a single HVDC converter at each side. It is envisaged, however, that more than one HVDC converter may be included on at least one of each side. It is envisaged, also, that different types of HVDC converters may be used. Examples of HVDC converters may include for example current source converters (CSCs) such as LCCs, or voltage source converters (VSCs) such as HB MMCs and FB MMCs.

As illustrated in FIG. 1, the HVDC transmission system 100 is arranged in a monopolar configuration, wherein power is returned through ground/earth. It is envisaged, also, that the HVDC transmission system 100 may instead be arranged such that power is returned through a DC transmission line, and/or that the HVDC transmission system 100 for example is arranged in a bipolar configuration using more than one DC transmission line each having a high potential with respect to ground. It may be envisaged that such multiple DC transmission lines form part of a DC transmission link (such as the DC transmission link 110).

During operation of the HVDC transmission system 100, one or more faults may occur. An example of such faults include a DC bus fault 150 wherein for example a shortcut is created between a line of the DC transmission link 110 and ground/earth, as illustrated by the cracked arrow 150. Another fault, a phase-to-ground fault 152, may occur if for example a shortcut is created between a phase line and ground/earth, as illustrated by the cracked arrow 152. The phase-to-ground fault 152 may occur between the HVDC converter 132 and the transformer 134, and be internal to the second converter station 130. The phase-to-ground fault 152 may occur between a single phase and ground/earth, or even between multiple phases and ground/earth. In some situations, the phase-to-ground fault 152 may for example occur at a location between the transformer 134 and one or more phase reactors connected to the HVDC converter 132. In some situations, the phase-to-ground fault 152 may for example occur at a location between the HVDC converter 132 and one or more of such phase reactors. Another type of fault may be an external AC fault 154 between an AC line and ground/earth at the AC bus side, or at least after the transformer 134, as illustrated by the cracked arrow 154.

As will be described later in more detail, the HVDC converter 132 may include a FB MMC and a HB MMC connected in series, with the FB MMC connected closer than the HB MMC to the DC transmission line in which power is delivered to the second converter station 130. When (or if) the internal phase-to-ground fault 152 occurs, high cell voltage and high valve currents may occur which may cause damage by over charging the cell capacitor voltages to above the rated limits. Due to the series connection, the FB MMC may for example be subjected to at least two times (2 pu) its rated arm voltage. To reduce the effect of overcharging, the DC current which eventually charges the capacitors in e.g. the FB MMC needs to be reduced to (or towards) zero. Herein, a VSC may include a plurality of converter cells connected in series in each arm of the VSC. A cell may include for example a half-bridge, or full-bridge configuration of switches (e.g. insulated-gate bipolar transistors) and at least one DC cell capacitance.

Exemplifying embodiments of the present disclosure will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

Figure 2A:
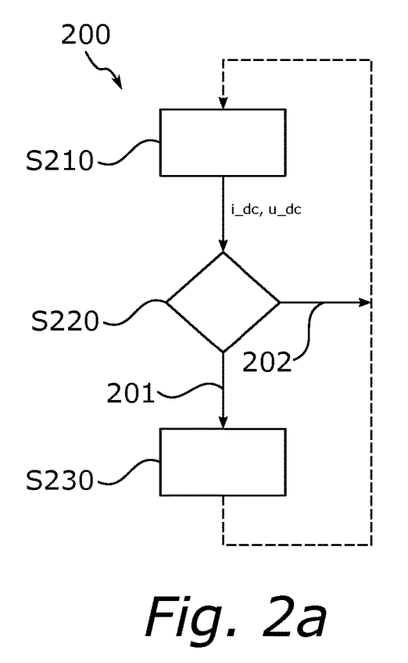
FIGS. 2a and 2b illustrate schematically flowcharts of embodiments of a method according to the present disclosure.
Figure 2B:
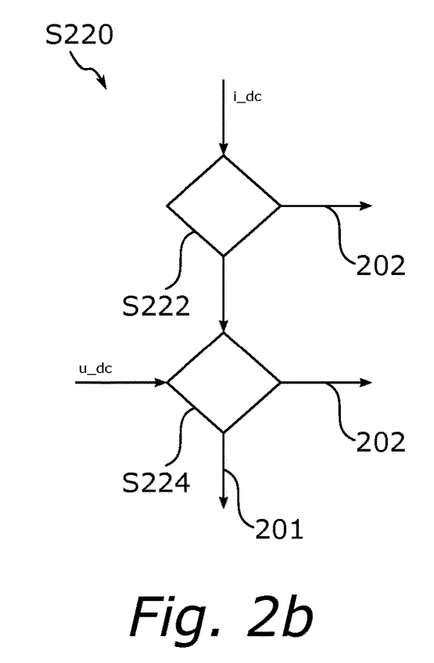

With reference to FIGS. 2a and 2b, various embodiments of a method of operating a converter station in a HVDC transmission system (such as the HVDC transmission system 100 as illustrated in FIG. 1) are described in the following.

FIG. 2a illustrates a flowchart of a method 200 of operating a converter station 130 in a HVDC transmission system 100. In a step S210, a DC current and a DC voltage are sensed at the first end 112 of the DC transmission link 100. The sensed DC current (i_dc) and the sensed DC voltage (u_dc) are then passed to a step S220, in which it is determined whether a phase-to-ground fault 152 has occurred at the second converter station 130 based on the sensed DC current and the sensed DC voltage. If it is determined in step S220 that the phase-to-ground fault 152 has occurred (result 201), the method may proceed to a step S230 in which the power delivered by the first converter station 120 to the second converter station 130 (via the DC transmission link 110) is reduced.

If it is determined in step S220 that the phase-to-ground fault 152 has not occurred (result 202), the method 200 may for example continue by returning back to step S210 again. If step S230 is reached, and the power is reduced, the method 200 may for example stop, return back to step S210, or continue to one or more other steps (not illustrated in FIG. 2a).

FIG. 2b illustrates in more detail the step S220 in one embodiment of the method 200. In a sub-step S222, the sensed DC current (i_dc) is received and compared with a threshold current value (i_dc_th). If it is determined that the sensed DC current is equal to or larger than the threshold current value (i_dc≥i_dc_th), the step S220 may proceed to the sub-step S224. In the sub-step S224, the sensed DC voltage (u_dc) is received, and based on the sensed DC voltage it is determined whether at least a partial recovery of the sensed DC voltage has occurred. If it is determined in sub-step S224 that the at least a partial recovery of the sensed DC voltage has occurred, the step S220 may exit with the result 201. To exit with the result 201 may correspond to determining that the phase-to-ground fault has occurred.

If it is determined in sub-step S224 that the at least a partial recovery of the sensed DC voltage has not occurred, the step S220 may for example exit with the result 202. Likewise, if it is determined in sub-step S222 that the sensed DC current is lower than the threshold current value (i_dc<i_dc_th), the step S220 may exit with the result 202. Exiting with the result 202 may correspond to determining that the phase-to-ground fault has not occurred.

In one embodiment of the method 200, determining the at least a partial recovery of the sensed DC voltage (as performed e.g. in the sub-step S224) may include comparing the sensed DC voltage (u_dc) against a threshold voltage value (u_dc_th). If the sensed DC voltage is equal to or larger than the threshold voltage value (u_dc≥u_dc_th), it may be determined that the at least a partial recovery of the sensed DC voltage has occurred. If the sensed DC voltage is lower than the threshold voltage value, it may be determined that the at least a partial recovery of the sensed DC voltage has not (yet) occurred. In some embodiments of the method 200, if it is determined that the sensed DC voltage has not yet recovered, the sensed DC voltage may be checked again during a finite time period. If the sensed DC voltage has, after the lapse of the finite time period, for example still not reached or exceeded the threshold voltage value, it may be determined that the at least a partial recovery of the sensed DC voltage has not occurred. This may indicate that a phase-to-ground fault is not present.

Figure 3A:
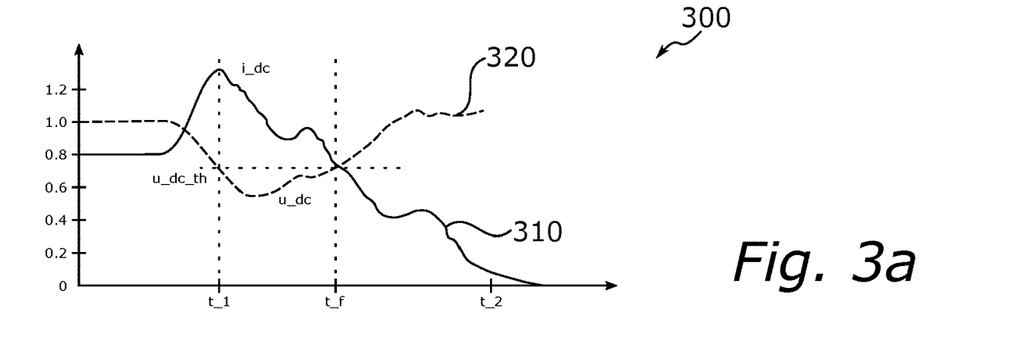
FIGS. 3a to 3d illustrate schematically the values of sensed DC currents and DC voltages during various faults.
Figure 3B:
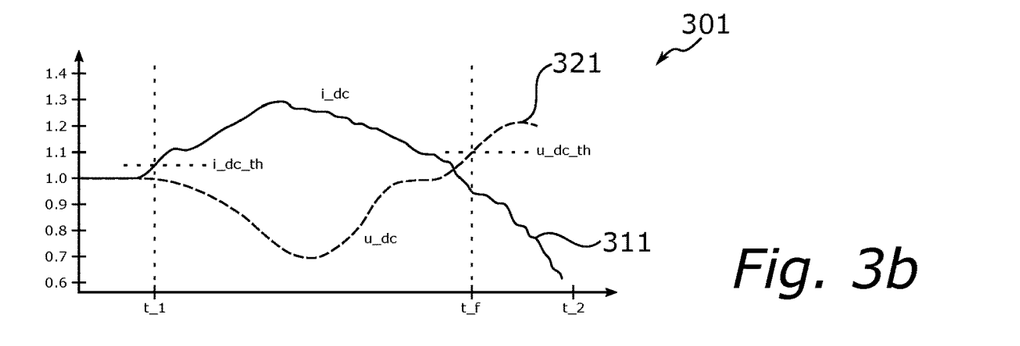

With reference to FIGS. 3a and 3b, example embodiments of the method 200 during a phase-to-ground fault will now be described in more detail.

FIG. 3a illustrates schematically a plot 300 of the time values of the DC current (i_dc, solid line 310) and the DC voltage (u_dc, dashed line 320) as a function of time t, and as sensed at the first converter station, before and during a phase-to-ground fault which occurs at the second converter station. The units on the vertical axis may for example correspond to units (pu) defined using the per-unit system, wherein the current is given as fractions of a defined base current, and wherein the voltage is given as fractions of a defined base voltage.

Before the phase-to-ground fault occurs, the sensed DC current 310 and the sensed DC voltage 320 are approximately constant over time. When the phase-to-ground fault occurs, the sensed DC current 310 starts to increase and assumes a maximal current value at a time t_1. At the time t_1, the value of the sensed DC voltage 320 is recorded, and this value is taken as the threshold voltage value (u_dc_th). In some embodiments, the time t_1 may be defined differently, for example as when the sensed DC current 310 has risen to or above a predefined threshold current value (not illustrated in FIG. 3a).

The method may then expect the sensed DC voltage 320 to recover, or at least partially recover, before a time t_2 which occurs after the time t_1. The time t_2 may for example be chosen to be a few tens of milliseconds after the time t_1. As may be seen from FIG. 3a, the sensed DC voltage 320 returns back to the threshold voltage value at a time t_f which occurs before the time t_2. At the time t_f, the method thus determines that the at least a partial recovery of the sensed DC voltage 320 has occurred and reduces the power delivered to the second converter station from the first converter station. The DC current 310 is reduced to zero, and a potentially dangerous overcharging of e.g. capacitors in the second converter station may be avoided. As the method may rely entirely on parameters available locally at the first converter station, such as the sensed DC current 310 and the sensed DC voltage 320, there is no need for a communication channel between the first converter station and the second converter station. As described earlier herein, this may increase the reliability of the HVDC transmission system, and also reduce its complexity and cost.

Similar to FIG. 3a, FIG. 3b illustrates schematically a plot 301 of the time values of the DC current (i_dc, solid line 311) and the DC voltage (u_dc, dashed line 321) as a function of time t, and as sensed at the first converter station, before and during a phase-to-ground fault which occurs at the second converter station.

Before the phase-to-ground fault occurs, the sensed DC current 311 and the sensed DC voltage 321 are approximately constant over time. When the phase-to-ground fault occurs, the sensed DC current 311 starts to increase and reaches the threshold current value (i_dc_th) at a time t_1.

The threshold current value is a predefined value, and corresponds to e.g. 1.05 pu. One "pu" (with regards to current) may for example be defined as when the DC current 311 equals the DC current order (i.e. the amount of current the converter station is expected to be delivered at a certain time). In the present example, a sensed current value of 1.05 pu may therefore indicate that the current has increased with 5% in relation to its expected value.

The time t_1 at which the sensed DC current 311 reaches the threshold current value is taken as an indication that a possible fault has occurred. The method then "waits" until a later time t_2, and expects the at least a partial recovery of the sensed DC voltage 321 to occur before the time t_2. In contrast to the embodiment of the method described with reference to FIG. 3a, in the embodiment of the method described with reference to FIG. 3b the threshold voltage value is defined as 1.1 pu (i.e. where the sensed DC voltage 321 rises to 10% above of the DC voltage order). As may be seen in FIG. 3b, this occurs at a time t_f. At the time t_f, it is determined that the at least a partial recovery of the sensed DC voltage 321 has occurred, and the first converter station is instructed to reduce the power delivered to the second converter station (via the HVDC transmission link). It may, of course, be envisaged to use other threshold voltage values than 1.1 pu, such as for example 0.9 pu.

In some embodiments of the method 200, instead of, or in addition to, waiting for the sensed DC voltage to reach or exceed a certain threshold voltage value, the method 200 may expect the sensed DC voltage to start increasing with a certain rate. Such an increase with a certain rate may indicate that the at least a partial recovery of the sensed DC voltage has started. The "certain rate of increase" may correspond to e.g. a time derivative of the sensed DC voltage being equal to or larger than a threshold voltage time derivative value. The time derivative of the sensed DC voltage may for example be obtained by calculating the change (or difference) in voltage between two sensed DC voltage values over time, and e.g. by dividing this difference with the difference in time between the times at which the two sensed DC voltage values were obtained. Other methods of obtaining the time derivative (or the "rate of change") may also be envisaged. A threshold voltage time derivative value may for example correspond to 0.02 pu, and/or be calculated as proportional to the power order supplied to the first converter station divided by the rated power of the first converter station. In some embodiments, the threshold voltage time derivative value may be e.g. zero, such that it is required that the sensed DC voltage is increasing. Using the time derivative of the sensed DC voltage may allow for a more accurate, and/or faster, detection of a phase-to-ground fault, and also to discriminate such a phase-to-ground fault against e.g. DC bus faults and/or external AC faults. It may, of course, be envisaged to use other threshold voltage time derivative values than 0.02 pu.

Likewise, in some embodiments of the method 200, instead of, or in addition to, waiting for the sensed DC current to reach or exceed a certain threshold current value before indicating a potential fault, the method 200 may expect the sensed DC current to start growing with a certain speed. This "speed of growth", or time derivative, of the sensed DC current may be obtained as described above for the sensed DC voltage, but using two or more sensed DC current values instead and comparing the calculated current time derivative against a threshold current time derivative value. Using the time derivative of the sensed DC voltage may allow for more accurate, and/or faster, detection of a phase-to-ground fault, and also to discriminate such a phase-to-ground fault against e.g. DC bus faults and/or external AC faults.

Figure 3C:
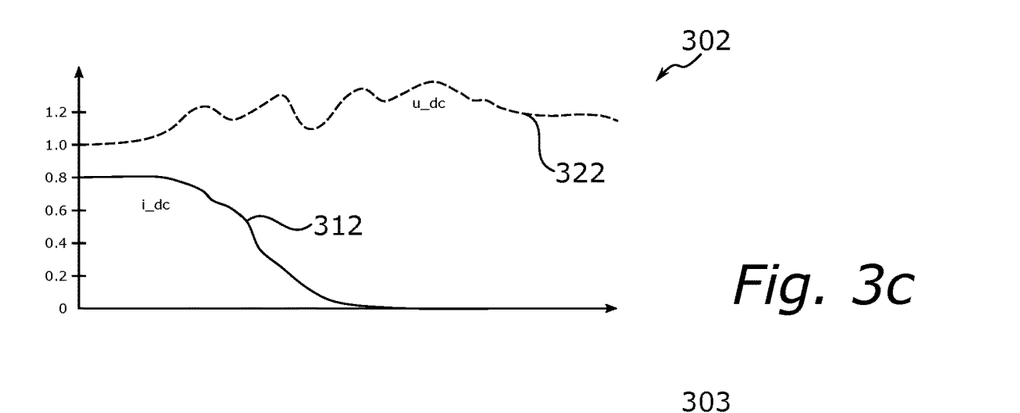
Figure 3D:
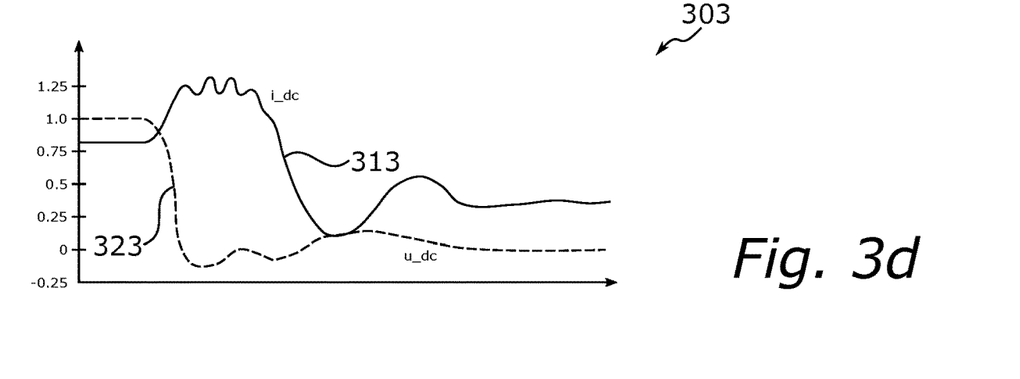

With reference to FIGS. 3c and 3d, the method 200 when subject to other faults than phase-to-ground faults will now be described in more detail.

FIG. 3c illustrates schematically a plot 302 of the time values of the DC current (i_dc, solid line 312) and the DC voltage (u_dc, dashed line 322) as a function of time t, and as sensed at the first converter station, before and during an external AC fault which occurs at the second converter station.

Before the external AC fault, the sensed DC current 312 and the sensed DC voltage 322 are approximately constant over time. When the external AC fault occurs, the sensed DC voltage 322 starts to rise while the sensed DC current 312 starts to fall. As there is no increase in the sensed DC current 312, the method 200 may discriminate against such an external AC fault.

FIG. 3d illustrates schematically a plot 303 of the time values of the DC current (i_dc, solid line 313) and the DC voltage (u_dc, dashed line 323) as a function of time t, and as sensed at the first converter station, before and during a DC bus fault which occurs at the HVDC transmission link.

Before the DC bus fault, the sensed DC current 313 and the sensed DC voltage 323 are approximately constant. When the DC bus fault occurs, the sensed DC current 313 starts to rise, while the sensed DC voltage 323 starts to fall. Even though the sensed DC current 313 may exceed a threshold current value, there is no recovery of the sensed DC voltage 323. Instead, the sensed DC voltage 323 approaches zero, and the method 200 may discriminate also against such a DC bus fault.

As has been shown with reference to FIGS. 3a to 3d, the method 200 according to the present disclosure may in a communicationless way (i.e. without requiring a communication channel) allow to locally, at the first converter station, properly determine the occurrence of a phase-to-ground fault at the second converter station. The method 200 may also properly discriminate such a phase-to-ground fault against e.g. external AC faults and DC bus faults. When it is determined that a phase-to-ground fault has occurred at the second converter station, the method may accordingly reduce the power delivered to the second converter station from the first converter station such that e.g. overcharging of cell capacitors in the second converter station is avoided.

In some embodiments of the method 200, the sensed DC current and voltage values may alternatively be filtered before they are used. Using filtered values may for example help to avoid mistakenly determining the occurrence of the phase-to-ground fault due to e.g. noise.

Figure 4:
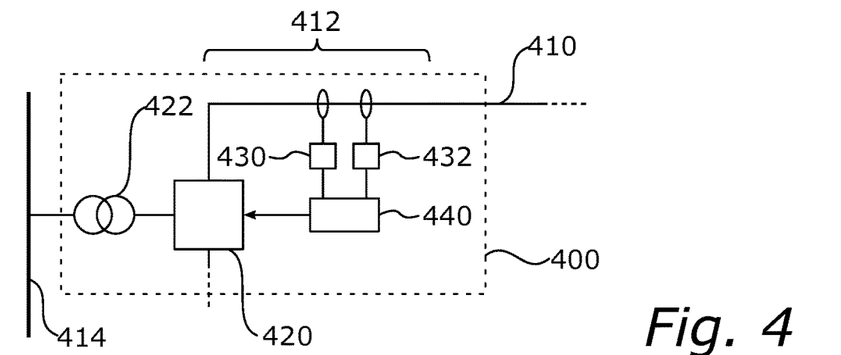
FIG. 4 illustrates schematically an embodiment of a converter station according to the present disclosure.

With reference to FIG. 4, an embodiment of a converter station according to the present disclosure will now be described in more detail.

FIG. 4 illustrates schematically a converter station 400. The converter station 400 may be included in a HVDC transmission system including a DC transmission link 410. The converter station 400 is connectable to a first end 412 of the DC transmission link 410. The converter station 400 is also connectable to an AC grid 414, such that the converter station 400 may operate to convert power between the AC grid 414 and the DC transmission link 410. At the other end of the DC transmission link 410, a second converter station (not illustrated in this figure) may be connected to receive power from the converter station 400, convert the received power back to AC power, and deliver the AC power to a second AC grid (not illustrated). The converter station 400, the DC transmission link 410 and also the second converter station may form part of the HVDC transmission system.

The converter station 400 includes at least one HVDC power converter 420, which performs the conversion between AC and DC power. The converter station 400 connects to the AC grid 414 through a transformer arrangement 422. The transformer arrangement 422 may be part of the converter station 400, but may also be considered to be a separate part.

The converter station 400 includes a current sensor 430 and a voltage sensor 432. The current sensor 430 is arranged to sense a DC current at, or close to, the first end 412 of the DC transmission link 410. Here, "close to", means that the sensed values are sensed locally to the converter station 400, and not e.g. far away along the DC transmission link 410 or at another converter station connected to the DC transmission link 410. Phrased differently, the current and the voltage may be measured (and the sensors located) at a position which is accessible by the converter station (i.e. without the need for a separate communication channel). With regards to the sensing of current and voltage, the word "end" of the DC transmission link is herein not to be defined as the very extremity of the DC transmission link, but rather as a side of the HVDC transmission system.

Likewise, the voltage sensor 432 is arranged to sense a DC voltage at, or close to, the first end 412 of the DC transmission link 410. Although illustrated as separate components/objects, it is envisaged that the current sensor 430 and the voltage sensor 432 may form part of a same component.

The converter station 400 further includes a controller 440 which receives the sensed DC current and DC voltage from the current sensor 430 and the voltage sensor 432, respectively. The sensed values may for example be communicated to the controller 440 using wires, or through one or more wireless links. It should be repeated for clarity that such communication of values is still considered to be local to the converter station 400, and the sensors 430 and 432 may for example be located within a same building/housing as e.g. the HVDC converter 420, or similar. Phrased differently, a distance between the converter station 400 and the second converter station is substantially larger than a distance between e.g. each of the sensors 430 and 432 and for example the HVDC converter 420.

The converter station 400 is arranged to determine, based on the sensed DC current and the sensed DC voltage, whether a phase-to-ground fault has occurred at the second converter station connected to the second end of the DC transmission link (as described above with reference to FIGS. 3a to 3d). The converter station 400 is further arranged to, if it is detected/determined that the phase-to-ground fault has occurred, control the converter station 400 so as to reduce a power delivered by the converter station 400 to the second converter station via the DC transmission link 410. This may be achieved e.g. by the controller 440 providing one or more control signals to the HVDC converter 420. If the HVDC converter is a current source converter (such as an LCC), the controller 440 may for example reduce the power delivered by providing adjusted (increased) firing angles to the HVDC converter 420. A firing angle may be defined as the time with which such an LCC delays/advances the opening of its respective thyristors.

In some embodiments, the controller 440 may be further arranged to perform the method 200 of which various embodiments has been described earlier herein.

The HVDC converter 420 may for example be an LCC, a HB MMC or a FB MMC. The converter station 400 may include more than one HVDC converter, and also more than one type of HVDC converters, and the exact amount and types may be tailored depending on the requirements (in terms of delivered power, available voltage, etc.) at the converter station 400.

Figure 5:
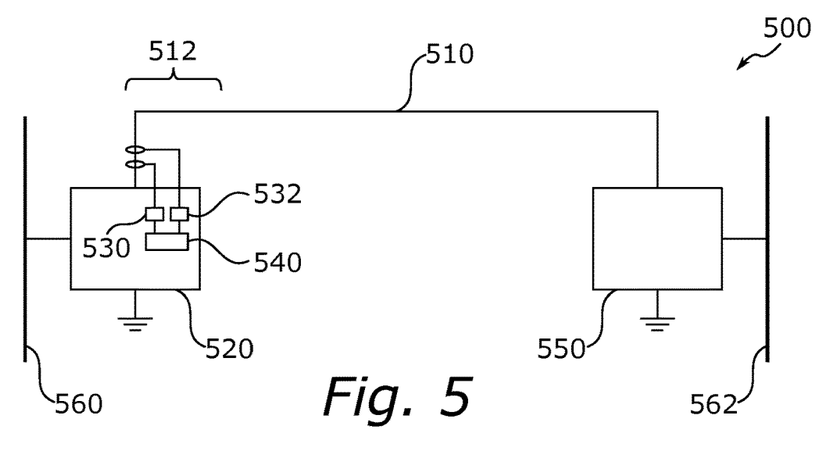
FIG. 5 illustrates schematically an embodiment of a HVDC transmission system according to the present disclosure.
Figure 6:
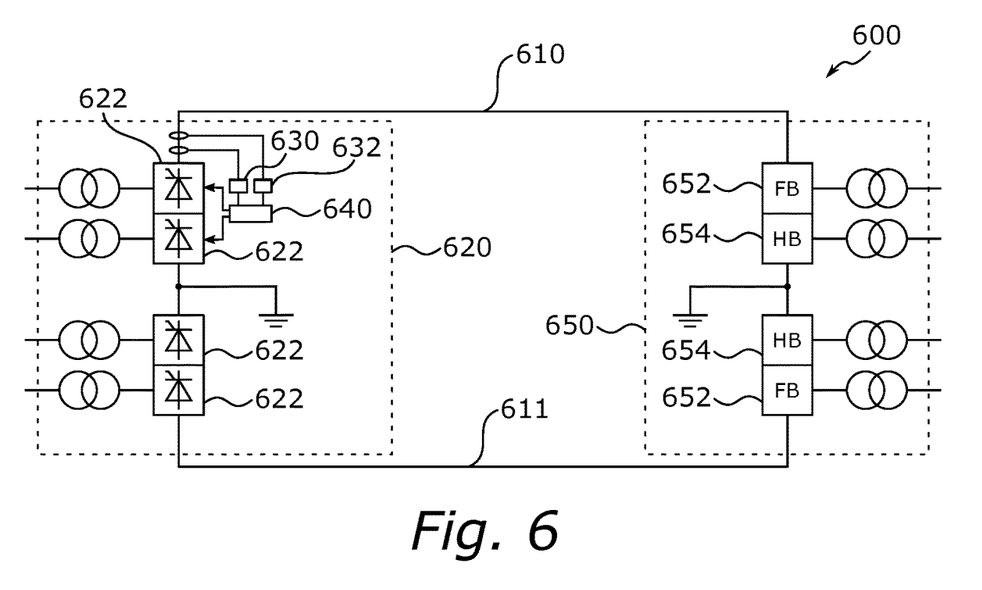
FIG. 6 illustrate schematically an embodiment of a HVDC transmission system according to the present disclosure.

With reference to FIGS. 5 and 6, embodiments of a HVDC transmission system according to the present disclosure will now be described in more detail.

FIG. 5 illustrates schematically an embodiment of a HVDC transmission system 500. The HVDC transmission system 500 includes a HVDC transmission link 510 (which may be for example a HVDC power line), a first converter station 520 and a second converter station 550. At least the first converter station 520 is a converter station as described earlier herein, e.g. the converter station 400 described with reference to FIG. 4. The HVDC transmission link 510 connects the first converter station 520 and the second converter station 550. The HVDC transmission system 500 may be further connected to AC grids 560 and 562, such that AC power on the AC grid 560 may be converted to DC power by the first converter station 520, delivered to the second converter station 550 via the DC transmission link 510, and then converted back to AC power by the second converter station 550 and output on the AC grid 562.

The first converter station 520 is connected at a first end 512 of the DC transmission link 510, and the first converter station 520 includes a current sensor 530 for sensing, at the first end 512, a DC current of the DC transmission link 510. The first converter station 520 also includes a voltage sensor 532 for sensing, at the first end 512, a DC voltage of the DC transmission link 510. The first converter station 520 also includes a controller 540 arranged to determine, based on the sensed DC current and the sensed DC voltage, the occurrence of a phase-to-ground fault at the second converter station 550, and to reduce the power delivered by the first converter station 520 if it is determined that such a phase-to-ground fault has occurred. For more details of the functioning of the first converter station 520 it is referred to the various embodiments of the method 200 and the converter station 400 described earlier herein.

FIG. 6 illustrates schematically an embodiment of a HVDC transmission system 600. The HVDC transmission system 600 is arranged in a bipolar configuration, and includes a HVDC transmission link including a first DC transmission line 610 and a second DC transmission line 611. The HVDC transmission system 600 includes a first converter station 620 and a second converter station 650. The converter stations 620 and 650 are connected to each other via the first and second DC transmission lines 610 and 612.

The first converter station 620 includes a plurality of current source converters (CSCs) 622 which are connected in series. The CSCs 622 may for example be LCCs. In the example illustrated in FIG. 6, two CSCs are connected in series between ground/earth and each pole (e.g. each one of the first and second DC transmission lines 610 and 611). As described earlier, the first converter station 620 also includes a current sensor 630, a voltage sensor 632 and a controller 640. The functionality of the current sensor 630, the voltage sensor 632 and the controller 640 are the same as described earlier herein e.g. with reference to FIG. 4. When determining that a phase-to-ground fault has occurred at the second converter station 650, the controller 640 may control the CSCs 622 to reduce the power delivered from the first converter station 620 to the second converter station 650, i.e.

by reducing the DC current on the first and second DC transmission links 610 and 611, without the need for any communication channel between the first converter station 620 and the second converter station 650. The controller 640 may control all of the CSCs 622. It may also be envisaged that a second controller (not shown), a second current sensor (not shown) and a second voltage sensor (not shown) are used to control e.g. the CSCs connected to the DC transmission line 611. Such a second current sensor and second voltage sensor may for example sense the current and voltage at the second DC transmission line 611.

The second converter station 650 may include multiple voltage source converters (VSCs) in different configurations. Between ground/earth and each of the first and second DC transmission lines 610 and 611, a mix of HB MMCs 654 and FB MMCs 652 may be connected in series. In the example illustrated in FIG. 6, one FB MMC 652 and one HB MMC 654 are connected between ground/earth and each one of the first and second DC transmission lines 610 and 611, but it is also envisaged that e.g. more than one of each type of VSC may be used and connected in series.

In the (hybrid) HVDC transmission system 600, the series connection of the two VSCs 652 and 654 may allow for Ultra HVDC. Using VSCs at the receiving (inverting) end of the HVDC transmission system 600 may reduce the problem of commutation failure which may occur e.g. if LCCs are used at both ends of the system. Due to the series connection, the VSC 652 closest to the respective first and second DC transmission line 610 and 611 at the second converter station 650 may be subject to very high voltage stress during a phase-to-ground fault at the second converter station 650. The method 200 and the converter station 400 of the present disclosure may therefore be suitable for detecting and acting upon the occurrence of such a phase-to-ground fault in the hybrid HVDC transmission system 600.

The person skilled in the art realizes that the present disclosure is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A method of operating a first converter station in a high voltage direct current (HVDC) transmission system including a direct current (DC) transmission link having a first end at which the first converter station is connected and a second end at which a second converter station is connected, the method comprising:
   sensing, at the first end of the DC transmission link, a DC current and a DC voltage of the DC transmission link;
   determining whether the sensed DC current is equal to or larger than a threshold current value, wherein it is determined that the sensed DC current is equal to or larger than the threshold current value;
   determining, on the basis that it is determined that the sensed DC current is equal to or larger than the threshold current value, whether at least a partial recovery of the sensed DC voltage has occurred, wherein it is determined that at least a partial recovery of the sensed DC voltage has occurred;
   determining, on the basis that it is determined that the at least a partial recovery of the sensed DC voltage has occurred, that a phase-to-ground fault has occurred; and
   in response to determining that a phase-to-ground fault has occurred, reducing a power delivered by the first converter station to the second converter station via the DC transmission link.

2. The method of claim 1, wherein determining whether at least a partial recovery of the sensed DC voltage has occurred comprises:
   determining that the sensed DC voltage is equal to or larger than a threshold voltage value; and
   in response to determining that the sensed DC voltage is equal to or larger than the threshold voltage value, determining that the at least a partial recovery of the sensed DC voltage has occurred.

3. The method of claim 2, wherein the threshold voltage value is a value of the sensed DC voltage at a first time, and wherein it is determined that the sensed DC voltage is equal to or larger than the threshold voltage before a second time succeeding the first time.

4. The method of claim 3, wherein the first time is a time when it is determined that the sensed DC current is equal to or larger than the threshold current value.

5. The method of claim 3, wherein the first time is a time when it is determined that the sensed DC current has assumed a maximum current value.

6. The method of claim 3, wherein a difference between the second time and the first time is equal to or less than approximately one cycle time of an AC frequency.

7. The method of claim 3, wherein the threshold voltage value is defined as the value of the sensed DC voltage at the first time.

8. The method of claim 1, wherein determining whether at least a partial recovery of the sensed DC voltage has occurred comprises:
   determining that a time derivative of the sensed DC voltage is equal to or larger than a threshold voltage time derivative value; and
   in response to determining that the time derivative of the sensed DC voltage is equal to or larger than the threshold voltage time derivative value, determining that the at least a partial recovery of the sensed DC voltage has occurred.

9. The method of claim 1, wherein the threshold current value is proportional to a power order used to control the first converter station.

10. A converter station for a high voltage direct current (HVDC) transmission system including a direct current (DC) transmission link, wherein the converter station is connectable to a first end of the DC transmission link and comprises:
    a current sensor for sensing a DC current at the first end of the DC transmission link;
    a voltage sensor for sensing a DC voltage at the first end of the DC transmission link, and
    a controller arranged to:
        determine whether the sensed DC current is equal to or larger than a threshold current value;

when it is determined that the sensed DC current is equal to or larger than the threshold current value, determine whether at least a partial recovery of the sensed DC voltage has occurred;

in response to determining that the sensed DC current is equal to or larger than the threshold current value and that at least a partial recovery of the sensed DC voltage has occurred, determine whether a phase-to-ground fault has occurred; and in response to determining that a phase-to-ground fault has occurred, control the converter station so as to reduce a power delivered by the converter station to the DC transmission link.

11. The converter station of claim 10, wherein the converter station includes a line-commutated converter (LCC), a half-bridge modular multilevel converter (HB MMC), or a full-bridge modular multilevel converter (FB MMC).

12. The converter station of claim 10, wherein the controller is configured to determine whether at least a partial recovery of the sensed DC voltage has occurred by:

determining that the sensed DC voltage is equal to or larger than a threshold voltage value; and in response to determining that the sensed DC voltage is equal to or larger than the threshold voltage value, determining that the at least a partial recovery of the sensed DC voltage has occurred.

13. The converter station of claim 10, wherein the controller is configured to determine whether at least a partial recovery of the sensed DC voltage has occurred by:

determining that a time derivative of the sensed DC voltage is equal to or larger than a threshold voltage time derivative value; and in response to determining that the time derivative of the sensed DC voltage is equal to or larger than the threshold voltage time derivative value, determining that the at least a partial recovery of the sensed DC voltage has occurred.

14. The converter station of claim 10, wherein the threshold current value is proportional to a power order used to control the converter station.

15. A HVDC transmission system, comprising:
a first converter station;
a second converter station; and
a DC transmission link having a first end connected the first converter station and a second end connected to the second converter station;

wherein the first converter station comprises:
a current sensor for sensing a DC current at the first end of the DC transmission link;
a voltage sensor for sensing a DC voltage at the first end of the DC transmission link, and
a controller configured to:
determine whether the sensed DC current is equal to or larger than a threshold current value;
when it is determined that the sensed DC current is equal to or larger than the threshold current value, determine whether at least a partial recovery of the sensed DC voltage has occurred;
when it is determined that the sensed DC current is equal to or larger than the threshold current value and that at least a partial recovery of the sensed DC voltage has occurred, determine whether a phase-to-ground fault has occurred; and
when it is determined that a phase-to-ground fault has occurred, control the first converter station to reduce a power delivered by the first converter station to the second converter station via the DC transmission link.

16. The HVDC transmission system of claim 15, wherein the second converter station includes a half-bridge modular multi-level converter (HB MMC) or a full-bridge modular multi-level converter (FB MMC).

17. The HVDC transmission system of claim 16, wherein the second converter station comprises a HB MMC and a FB MMC connected in series.

18. The HVDC transmission system of claim 17, wherein the FB MMC is connected closer than the HB MMC to a DC line of the DC transmission link on which power is delivered to the second converter station from the first converter station.

19. The HVDC transmission system of claim 15, wherein the first converter station includes a line-commutated converter (LCC).

20. The HVDC transmission system of claim 19, wherein the second converter station comprises a half-bridge modular multi-level converter (HB MMC) and a full-bridge modular multi-level converter (FB MMC) connected in series.

* * * * *